(12) United States Patent
Yang et al.

(10) Patent No.: US 9,230,675 B2
(45) Date of Patent: Jan. 5, 2016

(54) SEMICONDUCTOR MEMORY DEVICE USING A CURRENT MIRROR

(71) Applicant: SK Hynix Inc., Icheon-si, Gyeonggi-do (KR)

(72) Inventors: In Gon Yang, Icheon-si (KR); Sung Hoon Ahn, Seoul (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/745,144

(22) Filed: Jun. 19, 2015

(65) Prior Publication Data
US 2015/0287470 A1 Oct. 8, 2015

Related U.S. Application Data

(62) Division of application No. 13/719,196, filed on Dec. 18, 2012, now Pat. No. 9,093,124.

(30) Foreign Application Priority Data

Aug. 24, 2012 (KR) ........................ 10-2012-0093116

(51) Int. Cl.
G11C 11/34 (2006.01)
G11C 16/04 (2006.01)
G11C 16/28 (2006.01)

(52) U.S. Cl.
CPC ...................................... *G11C 16/28* (2013.01)

(58) Field of Classification Search
None
See application file for complete search history.

(56) References Cited

U.S. PATENT DOCUMENTS

2007/0030731 A1 2/2007 Honda
2013/0286746 A1* 10/2013 Choi .................... 365/185.22

FOREIGN PATENT DOCUMENTS

KR 1020050003394 A 1/2005
KR 1020050049720 A 5/2005
KR 1020100054476 A 5/2010

* cited by examiner

Primary Examiner — Kretelia Graham
(74) Attorney, Agent, or Firm — Haynes and Boone, LLP

(57) ABSTRACT

A semiconductor memory device is disclosed. The semiconductor memory device includes a current mirror configured to include a current mirror section for current of a first line to a second line and transistors coupled in parallel, a detector configured to control a voltage of the first line based on voltages of sensing nodes, a fail bit set section configured to control a voltage of the second line, and a comparator configured to compare the voltage of the first line with the voltage of the second line and generate a pass and fail check signal based on the comparing result.

9 Claims, 13 Drawing Sheets

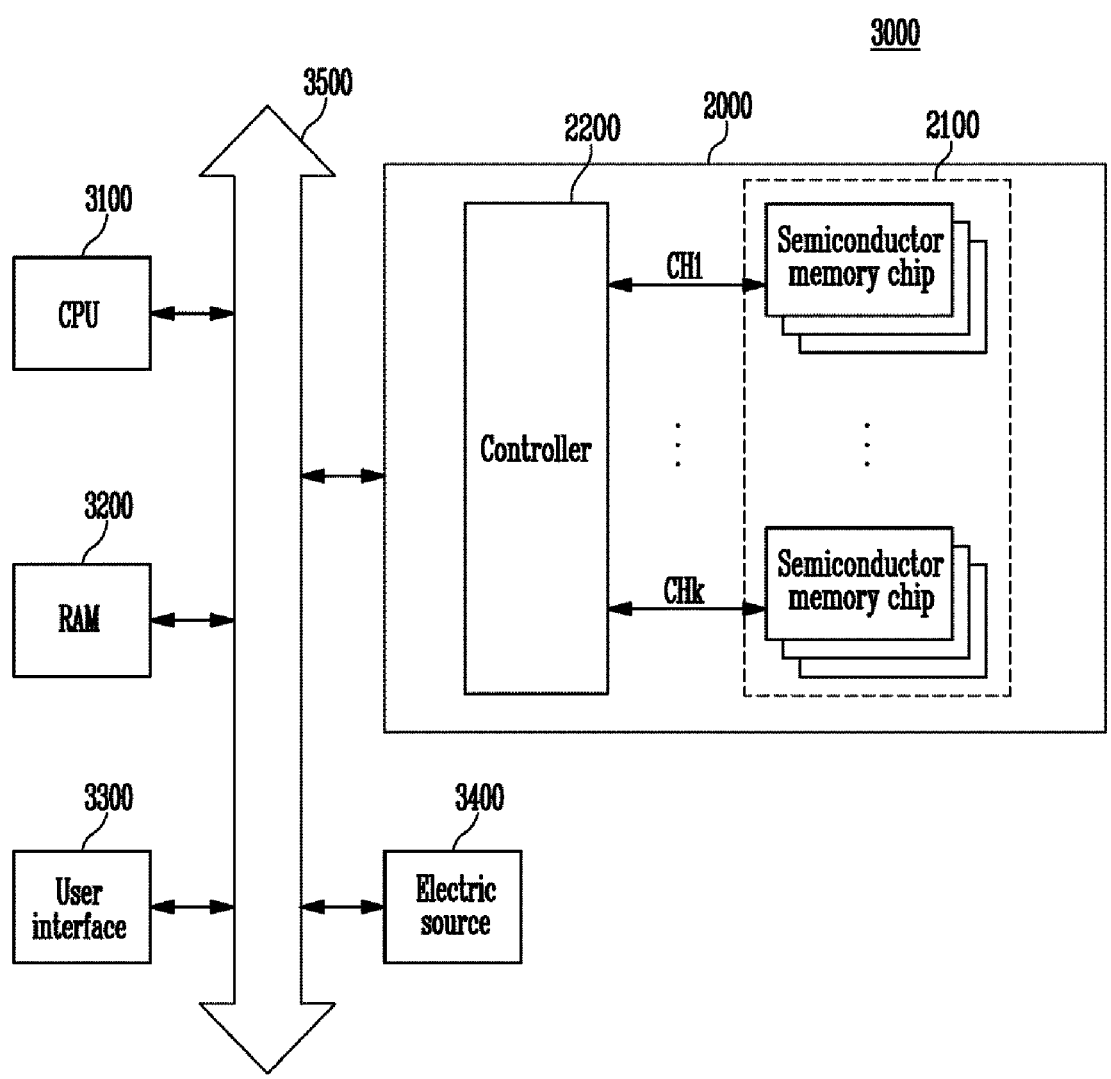

SEMICONDUCTOR MEMORY DEVICE USING A CURRENT MIRROR

CROSS-REFERENCE TO RELATED APPLICATION

This application is a divisional of U.S. patent application Ser. No. 13/719,196 filed Dec. 18, 2012, and claims priority to Korean Patent Application No. 10-2012-0093116, filed on Aug. 24, 2012, the contents of which are incorporated herein by reference in their entirety.

BACKGROUND

The present invention relates to an electronic device, more particularly relates to a semiconductor memory device.

A semiconductor memory may include memory devices embodied by using a semiconductor such as silicon Si, germanium Ge, gallium arsenide GaAs, indium phospide Inp, etc. The semiconductor memory may be divided into a volatile memory device and a non-volatile memory device.

Volatile memory device may include memory devices where stored data becomes lost if a power is not supplied. The volatile memory devices may include a static RAM SRAM, a dynamic RAM DRAM, a synchronous DRAM SDRAM and so on. Non-volatile memory devices may include memory devices where stored data remains though a power is not supplied. The non-volatile memory devices may include a read only memory ROM, a programmable ROM PROM, an electrically programmable ROM EPROM, an electrically erasable and programmable ROM EEPROM, a flash memory, a phase-change RAM PRAM, a magnetic RAM MRAM, a resistive RAM RRAM, a ferroelectric RAM FRAM, etc. Flash memory devices may include NOR-type memory devices and NAND-type memory devices.

It would be advantageous to have improved semiconductor memory devices with a lower likelihood of operational error. It would also be advantageous to have improved semiconductor memory devices which may adapt to changes and/or variations in fabrication steps and processes utilized to create the devices.

SUMMARY OF THE INVENTION

Embodiments of the present invention provides a semiconductor memory device having enhanced reliability.

A semiconductor memory device according to one embodiment includes a current mirror including a current mirror section configured to mirror current flowing through a first line to a second line, and transistors coupled in parallel between the current mirror section and a supply node; a detector coupled to the current mirror through the first line, and configured to control a voltage of the first line based on voltages of sensing nodes; a fail bit set section configured to control a voltage of the second line in response to bit set signals; a comparator configured to compare the voltage of the first line with the voltage of the second line, and generate a pass and fail check signal based on the comparing result; and a control logic configured to turn on or turn off the transistors.

The current flowing through the first line may be controlled by selectively turning on one or more of the transistors. The current flowing through the second line may be controlled by selectively turning on one or more of the transistors.

The current mirror section may include first transistors coupled in parallel to the first line and second transistors coupled in parallel to the second line. The transistors coupled in parallel to the current mirror section may include third transistors coupled between the first transistors and the supply node and fourth transistors coupled between the second transistors and the supply node. Gates of the first transistors are coupled to the first line, and gates of the first transistors are coupled to gates of the second transistors.

A semiconductor memory device according to another embodiment includes a memory cell array; a page buffer coupled to the memory cell array through sensing nodes; and a pass and fail check circuit, a first distance between the memory cell array and the pass and fail check circuit being higher than a second distance between the memory cell array and the page buffer. The page buffer is configured to control a voltage of a first line based on voltages of the sensing nodes. The pass and fail check circuit includes: a current mirror section configured to mirror current of the first line to a second line; transistors coupled in parallel between the current mirror section and a supply node; and a comparator configured to compare the voltage of the first line with a voltage of the second line to generate a pass and fail check signal.

A semiconductor memory device according to yet another embodiment includes a current mirror including a current mirror section configured to mirror current of a first line to a second line, and transistors coupled in parallel between the current mirror section and a supply node; detect transistors coupled in parallel between the first line and a reference node, and turned on in response to voltages of sensing nodes; reference transistors coupled in parallel between the second line and the reference node; and a comparator configured to compare a voltage of the first line with a voltage of the second line to generating a pass and fail check signal.

According to some embodiments, a reliability of a semiconductor memory device may be enhanced.

BRIEF DESCRIPTION OF THE DRAWINGS

The above and other features and advantages of the present invention will become readily apparent by reference to the following detailed description when considered in conjunction with the accompanying drawings wherein:

FIG. 17 is a block diagram illustrating a computing system including the memory system in FIG. 16 according to some embodiments.

DETAILED DESCRIPTION

Hereinafter, embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Figure 1:
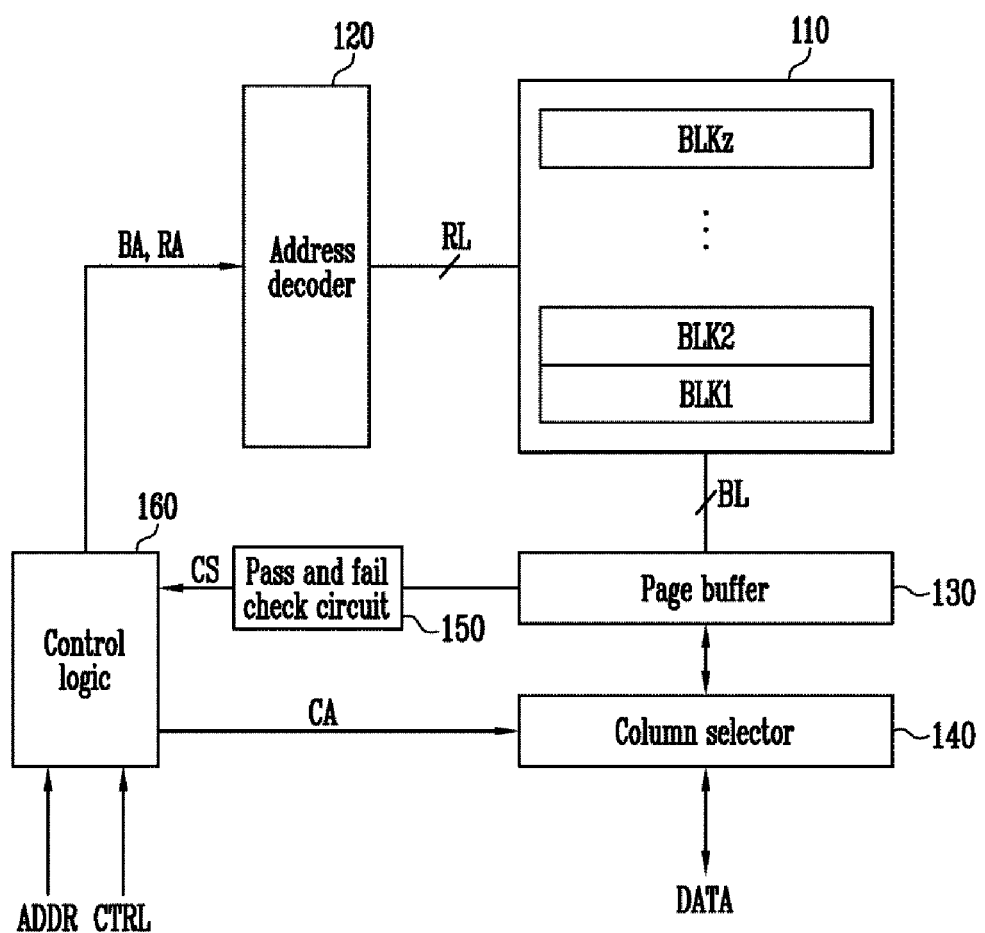
FIG. 1 is a block diagram illustrating a semiconductor memory device according to some embodiments.
Figure 2:
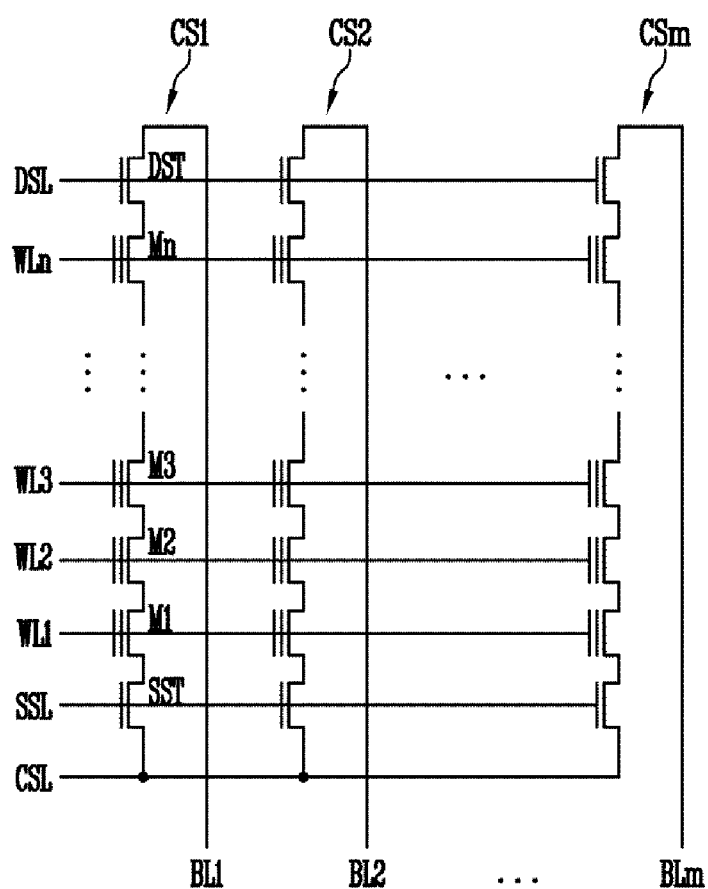
FIG. 2 is a circuit diagram of one of the memory blocks-in FIG. 1 according to some embodiments.

FIG. 1 is a block diagram illustrating a semiconductor memory device according to some embodiments. FIG. 2 is a circuit diagram of one of the memory blocks in FIG. 1 according to some embodiments.

In FIG. 1, the semiconductor memory device 100 may include a memory cell array 110, an address decoder 120, a page buffer 130, a column selector 140, a pass and fail check circuit 150, and a control logic 160.

The memory cell array 110 may be coupled to the address decoder 120 through row lines RL and may be coupled to the page buffer 130 through bit lines BL. The row lines RL may include a drain select line, word lines, and a source select line. Each of memory blocks BLK1-BLKz may include memory cells. According to some embodiments, memory cells disposed in a row direction may be coupled to the word lines. According to some embodiments, memory cells disposed in a column direction may be coupled to the bit lines BL.

In FIG. 2, the memory block BLK1 may be coupled to the page buffer (130 in FIG. 1) through a first to an mth bit lines BL1-BLm. The bit lines BL in FIG. 1 may include the first to the mth bit lines BL1-BLm.

The memory block BLK1 may be coupled to the address decoder (120 in FIG. 1) through a source select line SSL, a first to an nth word lines WL1-WLn, and a drain select line DSL. The source select line SSL, the first to the nth word lines WL1-WLn, and the drain select line DSL in FIG. 2 may be included in the row lines RL in FIG. 1.

The memory block BLK1 may include a first to an mth cell strings CS1-CSm. The first to the mth cell strings CS1-CSm may be coupled to the first to the mth bit lines BL1-BLm, respectively. Each cell string may include a source select transistor SST coupled to the source select line SSL, a first to an nth memory cells M1-Mn coupled to the first to the nth word lines WL1-WLn, and a drain select transistor DST coupled to the drain select line DSL. Source terminals of the source select transistors SST in the cell strings may be coupled in common to a common source line CSL. A drain terminal of each drain select transistor DST in each cell string may be coupled to corresponding bit line BL1-BLm.

Memory cells coupled to one word line of the first to the mth cell strings CS1-CSm may form one or more pages. In some embodiments, the memory cells may be coupled to one word line and form one page when the memory cell is a single level cell SLC. In some embodiments, the memory cells coupled to one word line may form two or more pages when the memory cell is a multi level cell MLC.

A second to the zth memory blocks BLK2-BLKz may have substantially the same structure as the first memory block BLK1 in FIG. 2.

Referring back to FIG. 1, the address decoder 120 may be coupled to the memory cell array 110 through the row lines RL. The address decoder 120 may operate in response to control of the control logic 160. The address decoder 120 may receive a block address BA and a row address RA of an address ADDR from the control logic 160.

The address decoder 120 may decode the block address BA of the received address ADDR. The address decoder 120 may select one memory block according to the decoded block address.

The address decoder 120 may decode the row address of the received address ADDR. The address decoder 120 may select one of the word lines coupled to a selected memory block according to the decoded row address.

The address decoder 120 may include a block decoder, a row decoder, and/or an address buffer, etc.

The page buffer 130 may be coupled to the memory cell array 110 through bit lines BL. The page buffer 130 may operate in response to control of the control logic 160.

In some embodiments, during a program operation, the page buffer 130 may receive data through the column selector 140 and deliver the received data to the bit lines BL. The delivered data may be programmed to memory cells of a selected word line. In a read operation, the page buffer 130 may read data from the memory cells of the selected word line through the bit lines BL and output the read data.

In some embodiments, a verify operation of verifying whether selected memory cells have desired threshold voltages may be performed after the program operation is performed. In some embodiments, a verify operation of verifying whether the selected memory cells have a desired threshold voltage may be performed after an erase operation is performed. In some embodiments, during the verify operation, the page buffer 130 may read the threshold voltages of the selected memory cells and deliver the read result to the pass and fail check circuit 150. Hereinafter, embodiments of the present invention will be described in relation to the verify operation performed after the program operation. However, the verify operation is not so limited and may be performed after other memory operations.

The column selector 140 may exchange data DATA with an external device or an input/output buffer (not shown) in the semiconductor memory device 100. The column selector 140 may operate in response to control of the control logic 160. The column selector 140 may receive a column address CA of the address ADDR from the control logic 160.

The column selector 140 may decode the column address CA. The column selector 140 may provide data corresponding to the decoded column address of the data DATA received from the column selector 140 to the page buffer 130 when the program operation is performed. The column selector 140 may output the data DATA corresponding to the decoded column address of data read from the page buffer 130 to an external device or the input/output buffer of the semiconductor memory device 100.

The pass and fail check circuit 150 may be coupled to the page buffer 130. The pass and fail check circuit 150 may operate in response to control of the control logic 160. A first distance between the pass and fail check circuit 150 and the memory cell array 110 may be higher than a second distance between the page buffer 130 and the memory cell array 110. During fabrication of the semiconductor memory device 100, first design rules applied to the pass and fail check circuit 150 may be different from second design rules applied to the page buffer 130.

In the verify operation, the pass and fail check circuit 150 may detect pass or fail of the verify operation based on a voltage of a detect node (DN in FIG. 5) of the page buffer 130. The pass and fail check circuit 150 may provide a check signal CS to the control logic 160 based on the detection result.

In some embodiments, the pass and fail check circuit 150 may activate the check signal CS in the event that every threshold voltage of the selected memory cells reaches desired levels. In another embodiment, the pass and fail check circuit 150 may activate the check signal CS in the event that a number of memory cells, for which threshold voltages do not reach the desired levels, is less than a preset number.

The control logic 160 may receive a control signal CTRL and the address ADDR from an external device or the input/output buffer of the semiconductor memory device 100. The control logic 160 may control operation of the semiconductor memory device 100 in response to the control signal CTRL. The control logic 160 may deliver the block address BA and the row address RA of the address ADDR to the address decoder 120. The control logic 160 may provide the column address CA of the address ADDR to the column selector 140.

The control logic 160 may receive the check signal CS from the pass and fail check circuit 150. The control logic 160 may control the semiconductor memory device 100 so that the program operation may be repeated based on the check signal CS.

The semiconductor memory device 100 may further include the input/output buffer even though it is not shown in FIG. 1. The input/output buffer may receive the control signal CTRL and the address ADDR from an external device and deliver the control signal CTRL and the address ADDR to the control logic 160. The input/output buffer may deliver the data DATA input from the external device to the column selector 140 and deliver the data DATA input from the column selector 140 to an external device.

In some embodiments, the semiconductor memory device may be a flash memory device.

Figure 3:
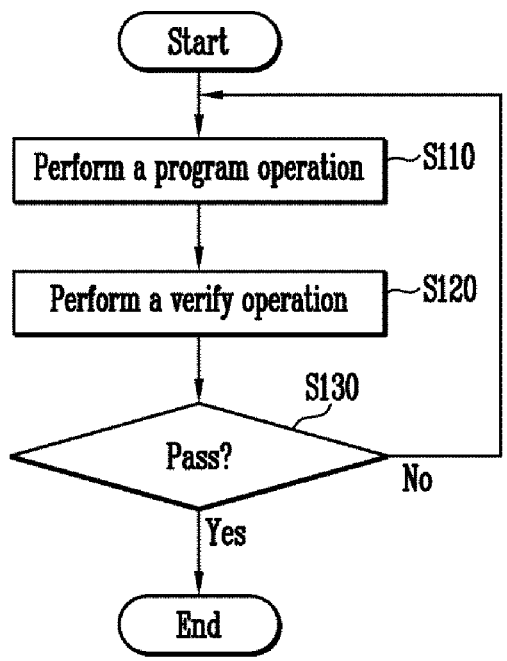
FIG. 3 is a flowchart illustrating a method of programming the semiconductor memory device in FIG. 1 according to some embodiments.
Figure 4:
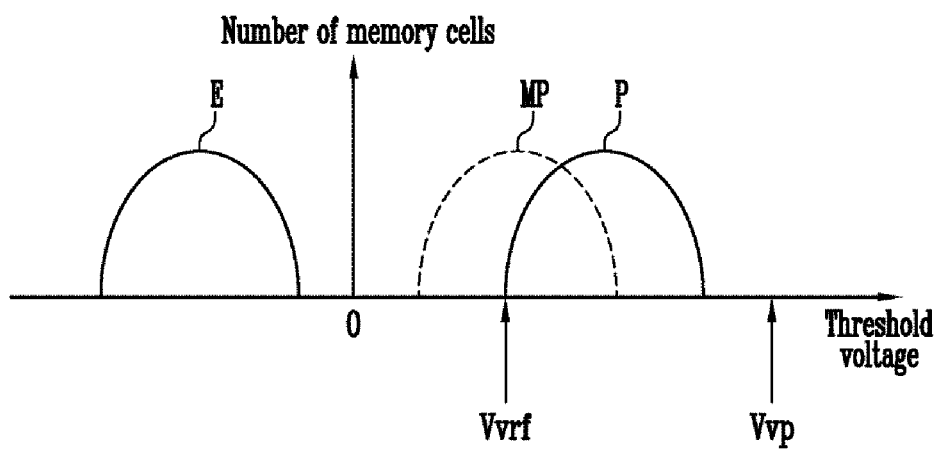
FIG. 4 is a diagram illustrating a threshold voltage distribution during a program operation for selected memory cells according to some embodiments.

FIG. 3 is a flowchart illustrating a method of programming the semiconductor memory device in FIG. 1 according to some embodiments. FIG. 4 is a diagram illustrating a threshold voltage distribution during a program operation to selected memory cells according to some embodiments.

A program operation may be performed in step S110. The address decoder 120 may provide a program pulse having a high voltage to a selected word line of a selected memory block and provide a pulse lower in voltage than the program pulse to word lines not selected. A reference voltage, e.g. 0V, or a program inhibition voltage, e.g. a supply voltage, may be supplied to bit lines (BL1-BLm in FIG. 2) according to data to be stored. As a result, memory cells having an erase state E have an increased threshold voltage or a threshold voltage corresponding to the erase state E.

In step S120, a verify operation may be performed. In the verify operation, the address decoder 120 may supply a verify voltage Vvrf to the selected word line and may supply a verify pass voltage Vvp to the word lines not selected.

In some embodiments, memory cells to be programmed have a middle program state MP. When memory cells have threshold voltages lower than the verify voltage Vvrf, which correspond to the middle program state MP, programming of these memory cells has failed and these memory cells is determined to store a bit value of "1". When memory cells have threshold voltages higher than the verify voltage Vvrf, which correspond to the program state P, programming of these memory cells has passed and these memory cells is determined to store a bit value of "0".

In step S130, it may be determined whether the verify operation is passed. When the result of the verify operation is passed, the program operation may be completed. When the verify operation is failed, the step S110 may be repeated. The result of the verify operation may be determined to be passed when a number of memory cells for which programming has failed is smaller than a preset number. The result of the verify operation may be determined to be failed when the number of the memory cells for which programming is failed is higher than the present number. The preset number may be adjusted according to bit set signals (BS in FIG. 6) transmitted to the pass and fail check circuit 150.

The memory cells to be programmed may reach threshold voltages corresponding to program state P by repeatedly performing the steps S110 to S130.

Figure 5:
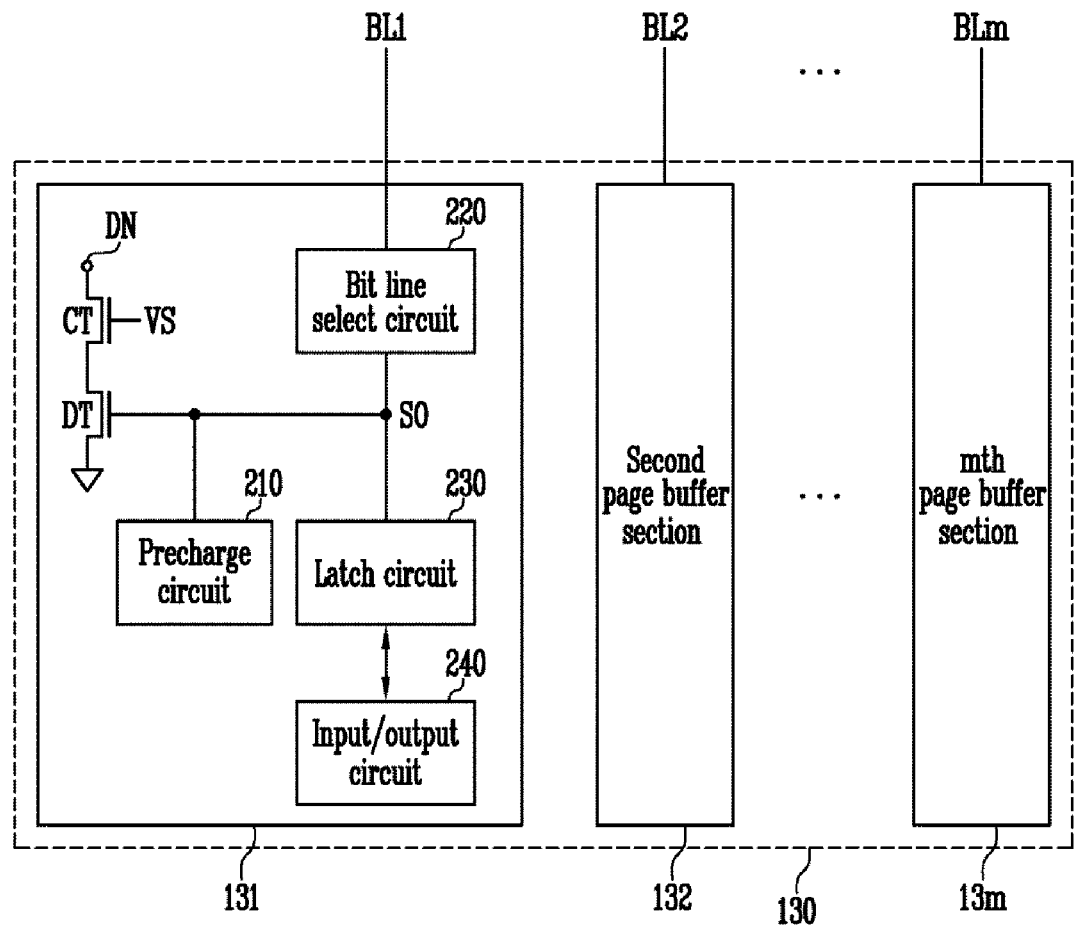
FIG. 5 is a block diagram illustrating the page buffer in FIG. 1 according to some embodiments.

FIG. 5 is a block diagram illustrating the page buffer in FIG. 1 according to some embodiments.

In FIG. 5, the page buffer 130 may include a first to an mth page buffer sections 131-13m. FIG. 5 omits internal elements of the second to the mth page buffer sections 132-13m. However, the second to the mth page buffer sections 132-13m may have substantially the same structure as the first page buffer section 131.

The first page buffer section 131 may include a precharge circuit 210, a bit line select circuit 220, a latch circuit 230, an input/output circuit 240, and a control transistor CT and a detect transistor DT coupled in series between the detect node DN and a ground or a reference node.

The precharge circuit 210 may be coupled to the sensing node SO. The precharge circuit 210 may precharge the sensing node SO to a certain voltage when the verify operation starts.

The bit line select circuit 220 may be coupled between a first bit line BL1 and the sensing node SO. The bit line select circuit 220 may electrically connect the sensing node SO to the first bit line BL1 after precharging the sensing node SO. A voltage of the sensing node SO may be determined according to the threshold voltage of a corresponding memory cell.

The latch circuit 230 may store a data bit corresponding to the voltage of the sensing node SO. That is, the latch circuit 230 may store data corresponding to a threshold voltage of the corresponding memory cell. The latch circuit 230 may include one or more latches. The data stored in the latch circuit 230 may be provided to the sensing node SO.

The input/output circuit 240 may be coupled between the latch circuit 230 and a column selector (140 in FIG. 1). The input/output circuit 240 may output data stored temporarily in the latch circuit 230 to the column selector 140 during the read operation and deliver data provided from the column selector 140 to the latch circuit 230 during the program operation.

The control transistor CT may be turned on or turned off in response to a verify signal VS. The verify signal VS may be received from the control logic 160. The detect transistor DT may be turned on or turned off according to the voltage of the sensing node SO. As a result, a voltage of a detect node DN may be determined based on the voltage of the sensing node SO.

In some embodiments, the detect nodes DN of each page buffer section may be coupled in common, which is not shown in FIG. 5. The detect node DN may be coupled to the pass and fail check circuit 150 as shown in FIG. 6.

Figure 6:
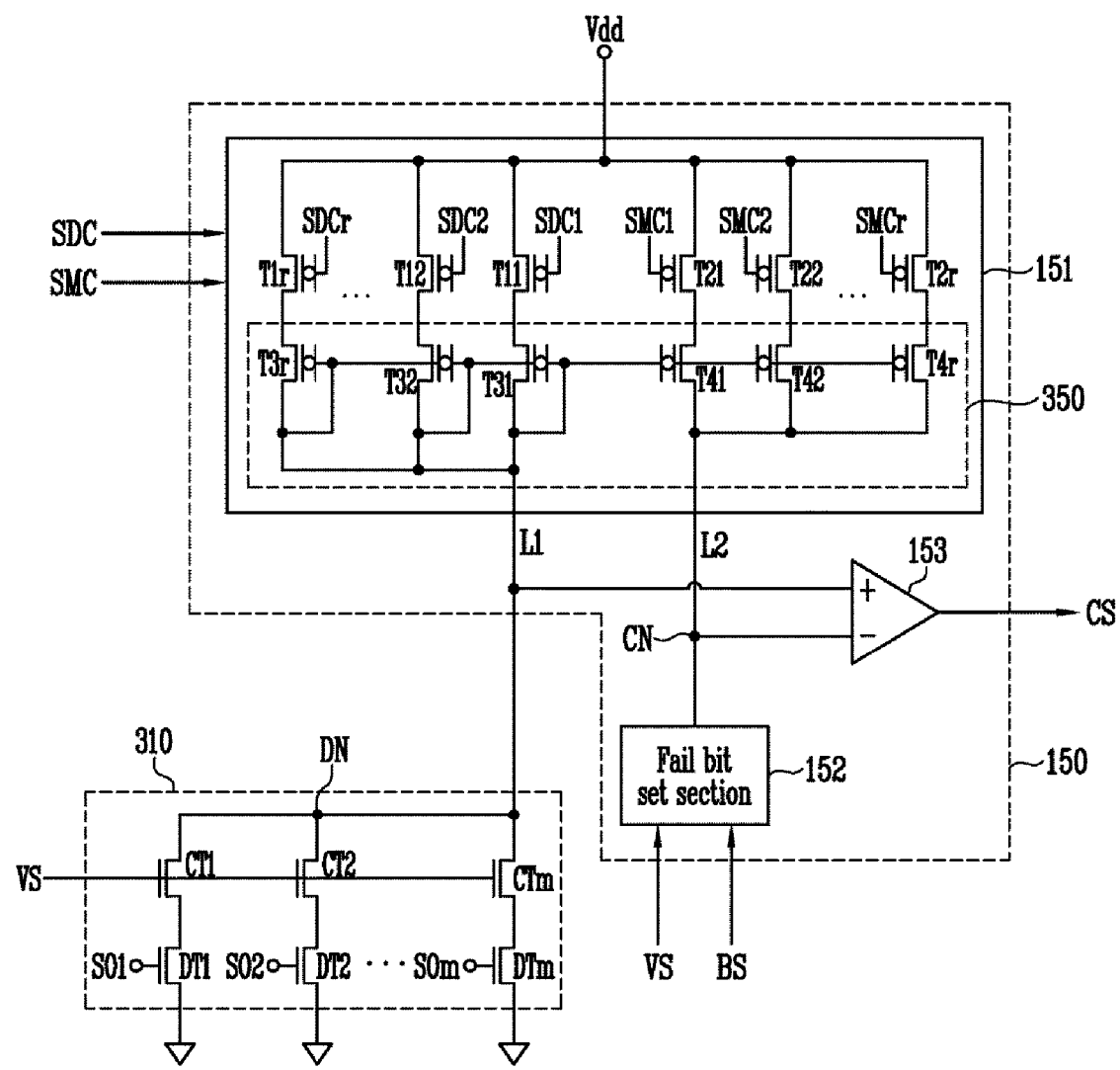
FIG. 6 is a block diagram illustrating a detector and a pass and fail check circuit according to some embodiments.

FIG. 6 is a block diagram illustrating a detector 310 and a pass and fail check circuit according to some embodiments.

In FIG. 6, the detector 310 may include control transistors CT1-CTm and detect transistors DT1-DTm. As described in FIG. 5, each of the control transistors, e.g. CT1 and each of the detect transistors, e.g. DT1 are included in one page buffer section, e.g. 131 in FIG. 1. The control transistors CT1-CTm and the detect transistors DT1-DTm may be included in the page buffer 130.

One control transistor, e.g. CT1, and one detect transistor, e.g. DT1, may be coupled in series between the detect node DN and a reference node. The control transistors CT1-CTm and the detect transistors DT1-DTm may be coupled in parallel between the detect node DN and the reference node. The control transistors CT1-CTm and the detect transistors DT1-DTm may form paths through which current of a first line L1 flows to the reference node.

The verify signal VS may be transmitted to the control transistors CT1-CTm from the control logic 160. The control transistors CT1-CTm may be turned on in response to the verify signal VS. In the verify operation, the verify signal VS may be activated with logic "1", turning the control transistors CT1-CTm on.

The first to the mth detect transistors DT1-DTm may operate in response to a first to an mth sensing nodes SO1-SOm, respectively. In some embodiments, each of the sensing nodes may have logic "1" when the threshold voltage of a corresponding memory cell is smaller than the verify voltage Vvrf. This corresponds to a memory cell for which programming has failed. In some embodiments, each of the sensing nodes may have logic "0" when the threshold voltage of the corresponding memory cell is higher than the verify voltage Vvrf. This corresponds to a memory cell for which programming has passed.

Because the program operation and the verify operation may be repeatedly performed, the number of the sensing nodes having logic "0" may increase and the number of the sensing nodes having logic "1" may be reduced. That is, the number of the detect transistors which are turned on may be reduced. Accordingly, the paths through which the current of the first line L1 flows to the reference node may be blocked. As a result, a voltage of the detect node DN may increase.

The pass and fail check circuit 150 may include a current mirror 151, a fail bit set section 152, and a comparator 153.

The current mirror 151 may be coupled to the detector 310 through the first line L1 and may be coupled to the fail bit set section 152 through a second line L2. The current mirror 151 may receive a supply voltage from a supply node Vdd. The current mirror 151 may receive sensing current control signals SDC and mirroring current control signals SMC from the control logic 160 and operate in response to the sensing current control signals SDC and the mirroring current control signals SMC. The sensing current control signals SDC in FIG. 6 include a first to an rth sensing current control signals SDC1-SDCr, and the mirroring current control signals SMC include a first to an rth mirroring current control signals SMC1-SMCr.

The current mirror 151 may include a current mirror section 350, first transistors T11-T1r, and second transistors T21-T2r.

The current mirror section 350 may mirror current flowing through the first line L1 to the second line L2. The current mirror section 350 may include third transistors T31-T3r coupled to the first line L1 and fourth transistors T41-T4r coupled to the second line L2 as shown in FIG. 6. However, the circuit of the current mirror section 350 in FIG. 6 is merely an example, at least one third transistor coupled to the first line L1 and one or more fourth transistors coupled to the second line L2 may be provided.

The third transistors T31-T3r may be coupled between the first line L1 and the first transistors T11-T1r, respectively. In each of the third transistors T31-T3r, a gate may be coupled to a drain. The fourth transistors T41-T4r may be coupled between the second line L2 and the second transistors T21-T2r, respectively. Gates of the third transistors T31-T3r may be coupled to gates of the fourth transistors T41-T4r.

The first transistors T11-T1r may be coupled in parallel between the supply node Vdd and the current mirror section 350. The first transistors T11-T1r may be turned on or turned off in response to the first to the rth sensing current control signals SDC1-SDCr, respectively. The second transistors T21-T2r may be coupled in parallel to the supply node Vdd and the current mirror section 350. The second transistors T21-T2r may be turned on in response to the first to the rth mirroring current control signals SMC1-SMCr, respectively.

In some embodiments, the current flowing through the first line L1 and the second line L2 may be adjusted by controlling the sensing current control signals SDC1-SDCr and the mirroring current control signals SMC1-SMCr. In some examples, the number of first transistors which are turned on may be controlled by using the sensing current control signals SDC1-SDCr, and thus adjusting the current flowing through the first line L1. In some examples, the current flowing through the first line L1 may get lower when a number of the first transistors T11-T1r which are turned on is reduced.

In some embodiments, the number of second transistors which are turned on may be controlled by using the mirroring current control signals SMC1-SMCr, and thus adjusting the current flowing through the second line L2. In some examples, the current flowing through the second line L2 may get lower when a number of the second transistors which are turned on is reduced.

The fail bit set section 152 may be coupled to the current mirror 151 through the second line L2. The fail bit set section 152 operates in response to the verify signal VS. The fail bit set section 152 may receive bit set signals BS from the control logic (160 in FIG. 1). An impedance of the fail bit set section 152 may be controlled by the bit set signals BS. The bit set signals BS may correspond to a minimum number of memory cells, for which programming is failed, but can be determined to be passed according to a result of the verify operation. A voltage of a comparing node CN may increase when the impedance of the fail bit set section 152 increases.

The comparator 153 may compare a voltage of the detect node DN with a voltage of the comparing node CN, and generates a check signal CS based on the comparing result. The check signal CS may be activated when the voltage of the detect node DN is higher than the voltage of the comparing node CN. The control logic 160 may finish the program operation when it receives the activated check signal CS. The check signal CS may not be activated when the voltage of the detect node DN is smaller than the voltage of the comparing node CN. The control logic 160 may control the semiconductor memory device 100 to repeat the program operation when the check signal is not activated.

In some embodiments, the current flowing through the first line L1 may be substantially identical to the current flowing through the second line L2. The voltage of the comparing node CN may be determined based on the impedance of the fail bit set section 152. As the program operation and the verify operation are repeatedly performed, the number of the of the first to the mth detect transistors DT1-DTm, which are turned on, may decrease and the voltage of the detect node DN may increase. When the voltage of the detect node DN gets higher than that of the comparing node CN, the number of the of the first to the mth detect transistors DT1-DTm which are turned on reaches the minimum number corresponding to the bit set signals BS. As a result, the check signal CS may be activated.

In some embodiments, the current flowing through the first line L1 may different from the current flowing through the second line L2. For example, when first design rules applied to the page buffer (130 in FIG. 1) may be different from second design rules applied to the pass and fail check circuit (150 in FIG. 1) during fabrication of the semiconductor memory device, and so the current flowing through the first line L1 may be different from that flowing through the second line L2. In some examples, as the number of the first to the mth detect transistors DT1-DTm which are turned on is reduced, the voltage of the detect node DN may get higher than the voltage of the comparing node CN before the number of the transistors which are turned on reaches the minimum number corresponding to the bit set signals BS. In some examples, as the number of the first to the mth detect transistors DT1-DTm which are turned on is reduced, the voltage of the detect node DN may be smaller than the voltage of the comparing node CN even though the number of the transistors which are turned on reaches the number corresponding to the bit set signals BS. Consequently, a reliability of the verify operation may be decreased.

In some embodiments, the current flowing through the first and the second lines L1 and L2 may be adjusted by the first transistors T11-T1r and the second transistors T21-T2r, respectively.

In some examples, when the number of the first transistors T11-T1r which are turned on decreases, a voltage supplied to the current mirror section 350 may get lower and the current flowing through the first line L1 may be reduced. Furthermore, when the number of the second transistors T21-T2r which are turned on decreases, a voltage supplied to the current mirror section 350 may get lower and the current flowing through the second line L2 may be reduced. In some embodiments, the semiconductor memory device may control the current mirror 151 so that the current flowing through the first line L1 is substantially identical to the current flowing through the second line L2 using the above approach. Accordingly, the reliability of the verify operation may be improved.

The detector 310 and the pass and fail check circuit 150 in FIG. 6 may be also applied to an operation other than the verify operation. In some embodiments, memory cells coupled to one row of the memory cell array 110 may further include flag cells for detecting whether the memory cells store a single bit data or a multi bit data. In some examples, the memory cells coupled to one row may include eight flag cells. "00000000" may be stored in the flag cells in the event that the memory cells store the multi bit data and "11111111" may be stored in the flag cells in the event that the memory cells store the single bit data. In some embodiments, when the semiconductor memory device employs the detector 310 and the pass and fail check circuit 150 in FIG. 6, it may detect that the memory cells store the multi bit data even though data read from the flag cells is "00000001".

Figure 7:
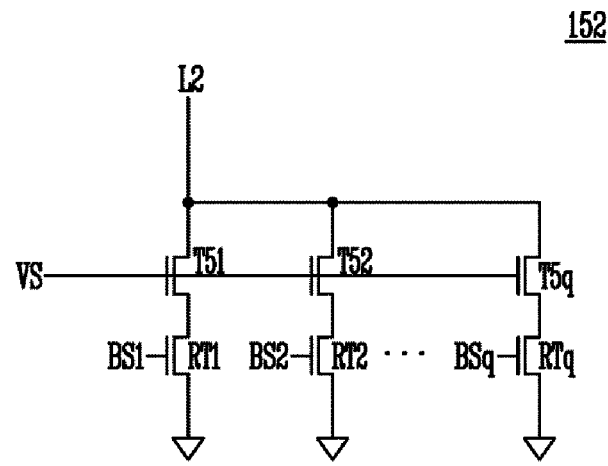
FIG. 7 is a circuit diagram of the fail bit set section in FIG. 6 according to some embodiments.

FIG. 7 is a circuit diagram of the fail bit set section in FIG. 6 according to some embodiments.

In FIG. 7, the fail bit set section 152 may include impedance elements. The fail bit set section 152 may include fifth transistors T51-T5$q$ and reference transistors RT1-RTq. The fifth transistors T51-T5$q$ and reference transistors RT1-RTq may be coupled in parallel between the second line L2 and the reference node.

The fifth transistors T51-T5$q$ may be turned on in response to the verify signal VS. The first to the qth reference transistors RT1-RTq may turned on in response to a first to a qth bit set signals BS1-BSq, respectively. The first to the qth bit set signals BS1-BSq may correspond to the bit set signals BS in FIG. 6. When a number of the reference transistors corresponding the bit set signals reduces, the impedance of the fail bit set section 152 may increase and the voltage of the comparing node CN increases. When the number of the reference transistors which are turned on reduces, the number of paths through which current of the second line L2 may flow to the reference node may reduce, and the voltage of the comparing node CN may increase.

In some embodiments, the number of the fifth transistors T51-T5$q$ which are turned on may be substantially identical to the minimum number of memory cells for which programming has failed, and may be determined to have passed according to the result of the verify operation. That is, the number of the bit set signals having logic "1" may be substantially identical to the number of the memory cells for which programming is failed, and may be determined to have passed according to the result of the verify operation.

Figure 8:
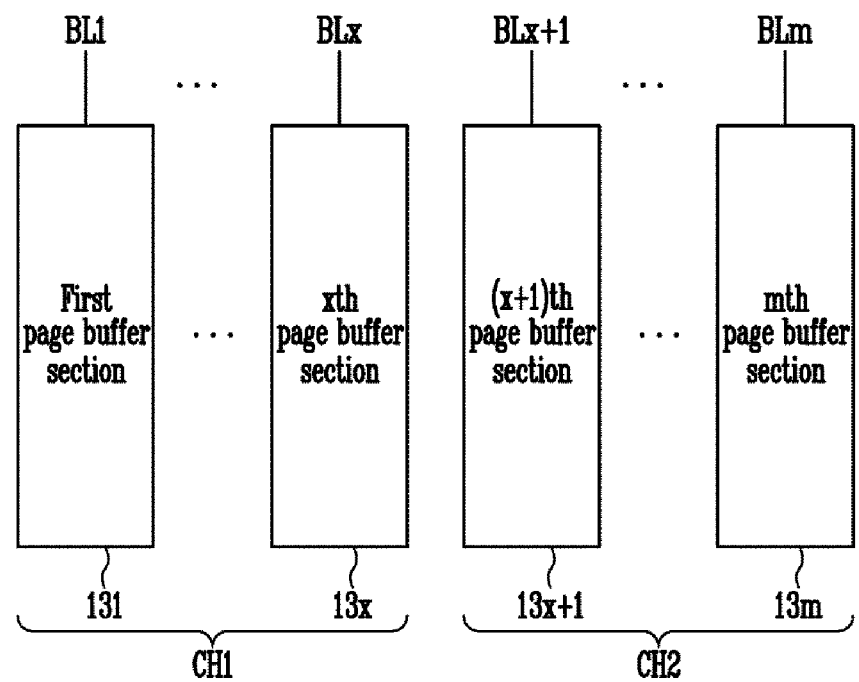
FIG. 8 is a block diagram illustrating page buffer sections divided in the unit of a chunk according to some embodiments.
Figure 9:
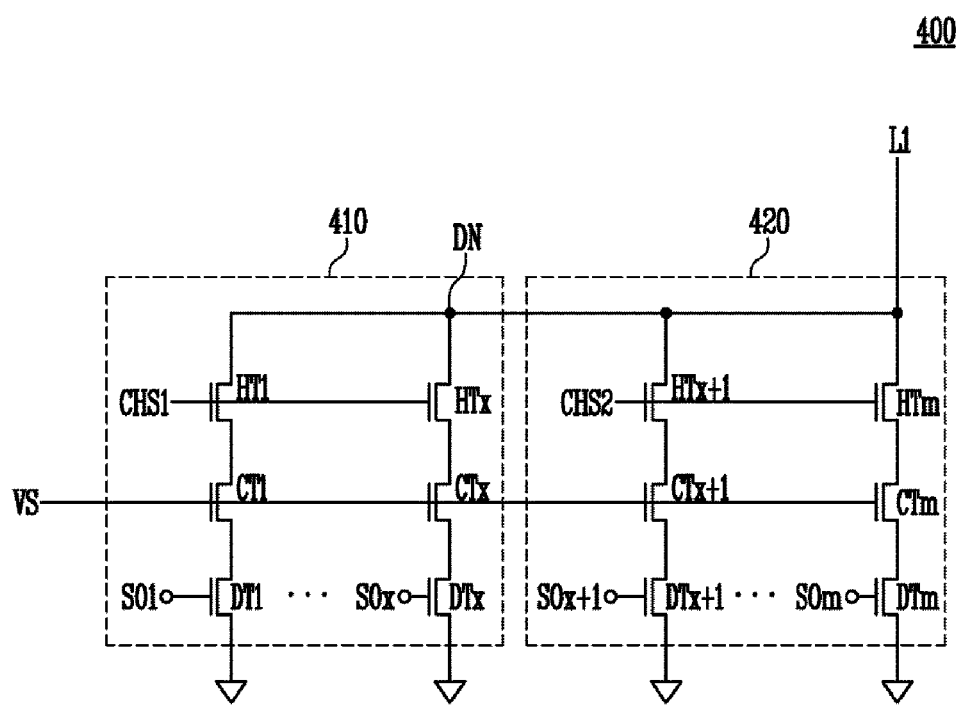
FIG. 9 is a view illustrating a detector according to some embodiments.

FIG. 8 is a block diagram illustrating page buffer sections divided in the unit of a chunk according to some embodiments. FIG. 9 is a view illustrating a detector according to some embodiments.

In FIG. 8, a first to an mth page buffer sections 131-13$m$ may be divided in chunks CH1 and CH2. A number of chunks into which the page buffer sections 131-13$m$ may be divided is not limited. In some embodiments, the first to the mth page buffers 131-13$m$ may be divided into three or more chunks.

In FIG. 9, a detector 400 may further include a first to an xth transistors HT1-HTx operating in response to a first chunk signal CHS1 and a (x+1)th to an mth chunk transistors HTx+1-HTm operating in response to a second chunk signal CHS2. The first and the second chunk signals CHS1 and CHS2 may be provided by the control logic 160.

In some embodiments, if the first to the mth page buffer sections 131-13$m$ are divided into the first and the second chunks CH1 and CH2 as shown in FIG. 8, the detector 400 may include a first detect section 410 and a second detect section 420.

In some embodiments, when the first chunk signal CHS1 has logic "1", the first to the xth chunk transistors HT1-HTx may be turned on, and the first detect section 410 may be selected. When, the second chunk signal CHS2 has logic "0", the second detect section 420 may be electrically separated from the first line L1. Accordingly, the voltage of the detect node DN may determined based on the first to the xth sensing nodes SO1-SOx when the detection operation is performed. In some embodiments, when the second detect section 420 is selected in response to the second chunk signal CHS2, the first detect section 410 may be electrically separated from the first line L1.

In some embodiments, the verify operation may be performed in the unit of chunk.

Figure 10:
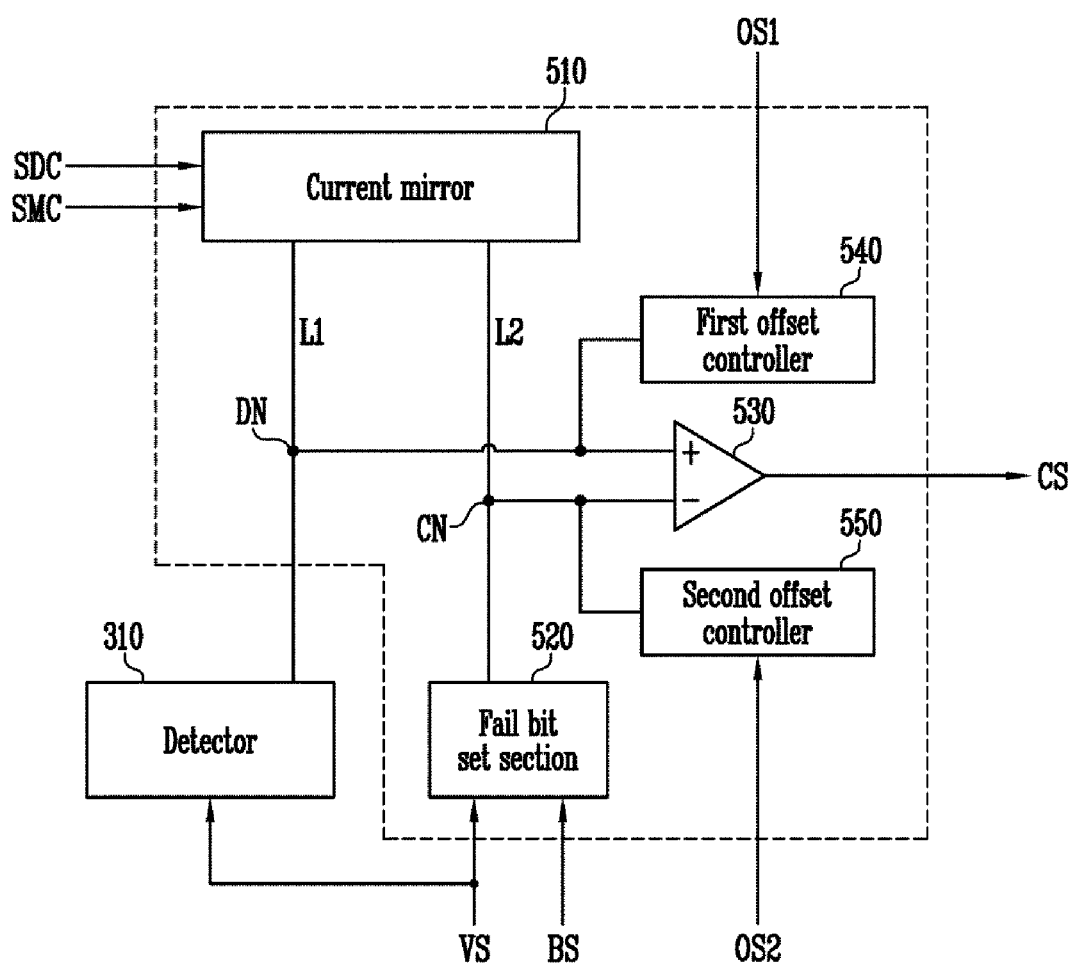
FIG. 10 is a block diagram illustrating a pass and fail check circuit and a detector according to some embodiments.

FIG. 10 is a block diagram illustrating a pass and fail check circuit and a detector 310 according to some embodiments.

In FIG. 10, the detector 310 may have substantially the same structure as the detector 310 of FIG. 6.

The pass and fail check circuit 500 may include a current mirror 510, a fail bit set section 520, a comparator 530, and a first and a second offset controller 540 and 550. The current mirror 510, the fail bit set section 520, and the comparator 530 may have substantially the same structure as the current mirror 151, the fail bit set section 152, and the comparator 153 of FIG. 6, respectively.

The first and the second offset controllers 540 and 550 may be coupled to a detect node DN and a comparing node CN, respectively. The first offset controller 540 may adjusts a voltage of the comparing node CN in response to first offset signals OS1 provided from the control logic (160 in FIG. 1). The second offset controller 550 may adjust a voltage of the detect node DN in response to second offset signals OS2 provided from the control logic 160.

Figure 11:
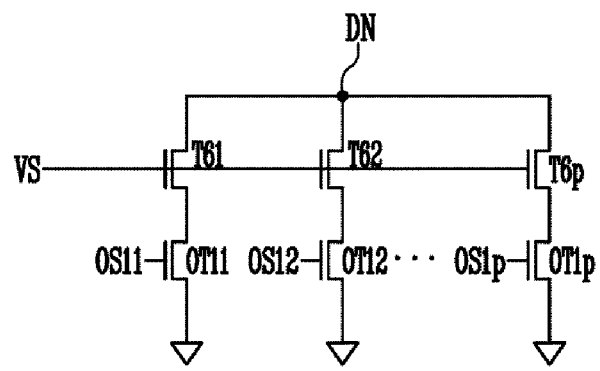
FIG. 11 is a circuit diagram of the first offset controller in FIG. 10 according to some embodiments.

FIG. 11 is a circuit diagram of the first offset controller in FIG. 10 according to some embodiments.

In FIG. 11, the first offset controller 540 may include sixth transistors T61-T6$p$ coupled in parallel between the detect node DN and a reference node and first offset transistors OT11-OT1$p$. The sixth transistors T61-T6$p$ are turned on in response to the verify signal VS provided by the control logic (160 in FIG. 1) when the verify operation is performed. The first offset transistors OT11-OT1$p$ may be turned on in response to first offset signals OS11-OS1$p$, respectively. Paths through which current of the first line L1 flows to the reference node may be determined based on the first offset signals OS11-OS1$p$. Accordingly, the voltage of the detect node DN may be controlled by the first offset signals OS11-OS1$p$.

Figure 12:
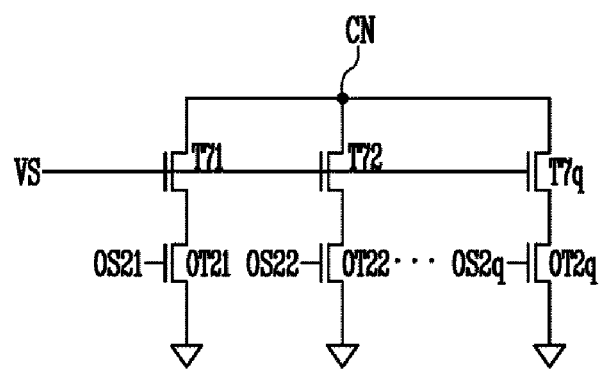
FIG. 12 is a circuit diagram of the second offset controller in FIG. 10 according to some embodiments.

FIG. 12 is a circuit diagram of the second offset controller in FIG. 10 according to some embodiments.

In FIG. 12, the second offset controller 550 may include seventh transistors T71-T7$q$ and second offset transistors OT21-OT2$q$ coupled in parallel between the comparing node CN and the reference node. The seventh transistors T71-T7$q$ may be turned on in response to the verify signal VS when the verify operation is performed. The second offset transistors OT21-OT2$q$ may be turned on in response to second offset signals OS21-OS2$q$, respectively. Paths through which current of the second line L2 flows to the reference node may be determined based on the second offset signals OS21-OS2$q$. Accordingly, the voltage of the comparing node CN may be controlled by the second offset signals OS21-OS2$q$.

In some embodiments, current flowing through the first and the second lines L1 and L2 may be adjusted by the first and the second offset controllers 540 and 550 as well as the current mirror 510. Accordingly, reliability of the verify operation may be further improved.

Figure 13:
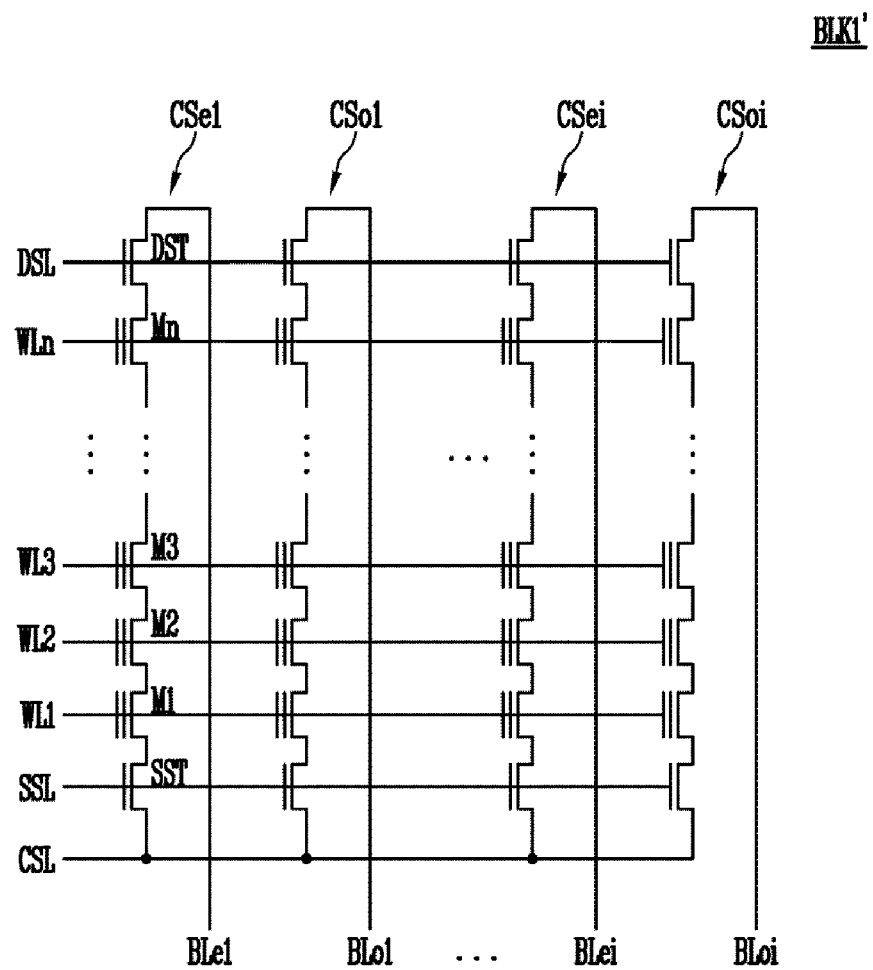
FIG. 13 is a view illustrating one of the memory blocks in FIG. 1 according to some embodiments.

FIG. 13 is a view illustrating one of the memory blocks BLK1-BLKz in FIG. 1 according to some embodiments.

Referring to FIG. 1 and FIG. 13, a memory block BLK1' may be coupled to the page buffer 130 through a first to an ith even bit lines BLe1-BLei and a first to an ith odd bit lines BLo1-BLoi. The memory block BLK1' may be coupled to the address decoder 120 through the source select line SSL, the first to the nth word lines WL1-WLn, and the drain select line DSL.

The memory block BLK1' may include cell strings CSe1-CSei and CSo1-CSoi. The even cell strings CSe1-CSei may be coupled to the first to the ith even bit lines BLe1-BLei, respectively. The odd cell strings CSo1-CSoi may be coupled to the first to the ith odd bit lines BLo1-BLoi, respectively. Each of the cell strings includes a source select transistor SST coupled to the source select line SSL, a first to an nth memory cells M1-Mn coupled to the first to the nth word lines WL1-WLn, and a drain select transistor DST coupled to a drain select line DSL.

Memory cells coupled to one word line of the even cell strings CSe1-CSei may form one or more pages. In some example, when the memory cells are single level cells, the memory cells coupled to one word line of the even cell strings CSe1-CSei may form one page.

Similarly, the memory cells coupled to one word line of the odd cell strings CSo1-CSoi may form one or more pages.

The memory cells coupled to one word line of the even cell strings CSe1-CSei may be referred to as an even page. The memory cells coupled to one word line of the odd cell strings CSO1-CSoi may be referred to as an odd page.

One even bit line, e.g. BLe1 and one odd bit line, e.g. BLo1 form one pair of bit lines, and the pair of the bit lines may be coupled to one page buffer section. This will be described in further detail with reference to accompanying drawing FIG. 14.

Figure 14:
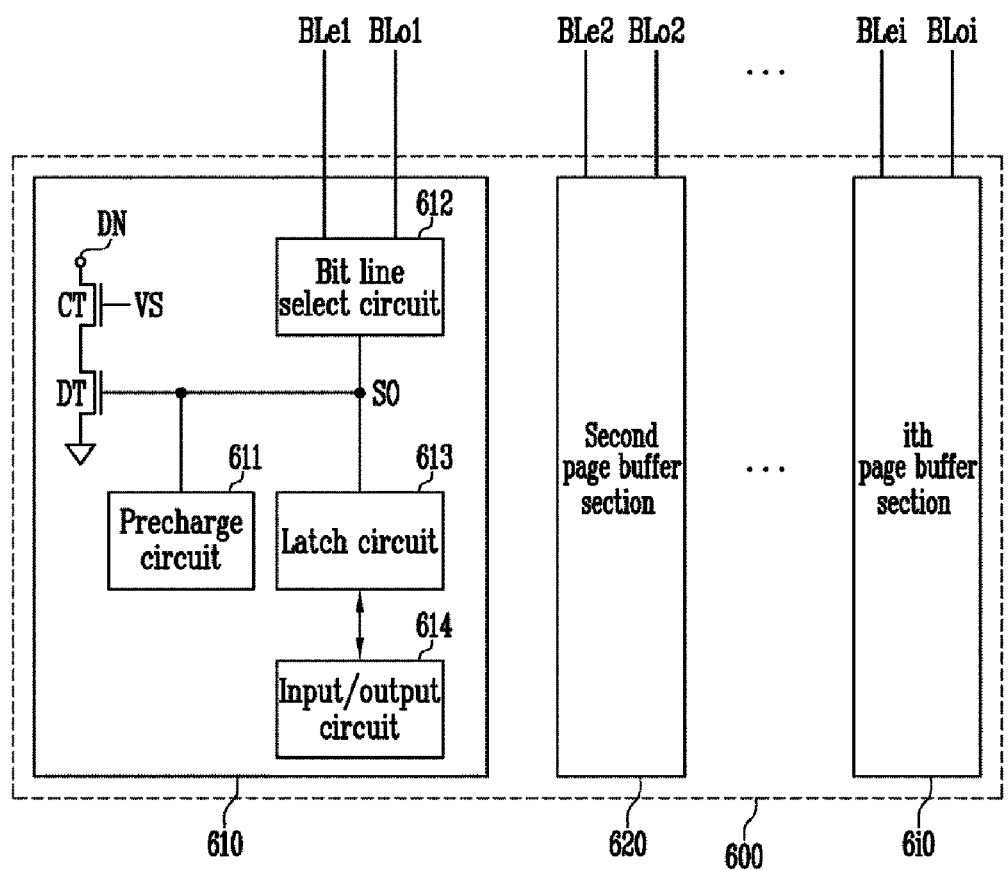
FIG. 14 is a block diagram illustrating the page buffer in FIG. 1 according to some embodiments.

FIG. 14 is a block diagram illustrating a page buffer in FIG. 1 according to some embodiments.

In FIG. 14, a page buffer 600 may include a first to an ith page buffer sections 610-6$i$0. The first to the ith page buffer sections 610-6$i$0 may be have substantially the same structure as the page buffer section 131 as shown in FIG. 5 except that one page buffer section is coupled to either the even bit line or the odd bit line.

One page buffer section 610 may include a precharge circuit 611, a bit line select circuit 612, a latch circuit 613, an input/output circuit 614, and a control transistor CT and a detect transistor DT coupled in series between a detect node DN and a reference node. The precharge circuit 611, the latch circuit 613, the input/output circuit 614, the control transistor CT, and the detect transistor DT may have substantially the same structure as the corresponding elements in FIG. 5.

The bit line select circuit 612 may be coupled to the even bit line BLe1 and the odd bit line BLo1 in one pair of the bit lines. The bit line select circuit 612 may select one of the even bit line BLe1 and the odd bit line BLo1 in response to control of the control logic 160.

The even bit lines BLe1-BLei or the odd bit lines BLo1-BLoi may be selected during a program operation. That is, the even page or the odd page may be selected and programmed during the program operation. The sensing node SO may be coupled to the even bit lines BLe1-BLei when a program operation of the even page is performed. The sensing node SO is coupled to the odd bit lines BLo1-BLoi when a program operation of the odd page is performed.

Figure 15:
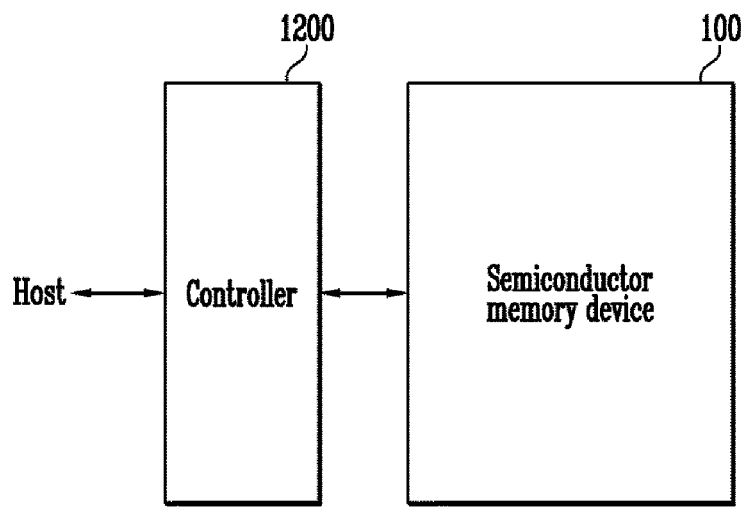
FIG. 15 is a block diagram illustrating a memory system including the semiconductor memory device in FIG. 1 according to some embodiments.

FIG. 15 is a block diagram illustrating a memory system including the semiconductor memory device in FIG. 1 according to some embodiments.

In FIG. 15, the memory system 1000 may include the semiconductor memory device 100 and a controller 1200.

The semiconductor memory device 100 may include elements in FIG. 1 to FIG. 14.

The controller 1200 may be coupled to a host and the semiconductor memory device 100. The controller 1200 may access the semiconductor memory device 100 in response to requests of the host. For example, the controller 1200 may control a read operation, a program operation, an erase operation, and/or a background operation of the semiconductor memory device 100. The controller 1200 may provide an interface between the semiconductor memory device 100 and the host. The controller 1200 may include a firmware for controlling the semiconductor memory device 100.

In some embodiments, the controller 1200 may include elements such as a random access memory RAM, a processing unit, a host interface, and a memory interface. The RAM may be used as at least one of an operation memory of the processing unit, a cache memory between the semiconductor memory device 100 and the host, and/or a buffer memory between the semiconductor memory device 100 and the host. The processing unit may control operation of the controller 1200.

The host interface may include a protocol for exchanging data between the host and the controller 1200. In some embodiments, the controller 1200 may communicate with the host through at least one of various protocols such as an universal serial bus USB protocol, a multimedia card MMC protocol, a peripheral component interconnection PCI protocol, a PCI-express PCI-E protocol, an advanced technology attachment ATA protocol, a serial-ATA protocol, a parallel-ATA protocol, a small computer small interface SCSI protocol, an enhanced small disk interface ESDI protocol, an integrated drive electronics IDE protocol, and/or a private protocol, etc.

The memory interface may interface with the semiconductor memory device 100. For example, the memory interface may include a NAND flash interface or a NOR flash interface.

The memory system 1000 may further include an error correction block. The error correction block may detect and correct errors in data read from the semiconductor memory device 100 by using an error correction code ECC. In some embodiments, the error correction block may be included in the controller 1200.

In the program operation of the semiconductor memory device, the program operation may finish when the number of memory cells, for which programming has failed, is smaller than a preset number, even though the failed memory cells may be present. That is, the data stored in the semiconductor memory device 100 may include errors. The error correction block may detect and correct error in the read operation.

The controller 1200 and the semiconductor memory device 100 may be integrated in one memory device. In some embodiments, a memory card may be realized by integrating the controller 1200 and the semiconductor memory device 100 in one memory device. For example, the memory card such as a personal computer memory card international association PCMCIA, a compact flash card CF, a smart media card SMC, a memory stick, a multimedia card MMC, RS-MMC or MMCmicro, an SD card SD, miniSD, micor SD or SDHC, and/or an universal flash storage device UFS, etc. may be realized by integrating the controller 1200 and the semiconductor memory device 100 in one memory device.

A solid state drive SSD may be created by integrating the controller 1200 and the semiconductor memory device 100 in one memory device. The SSD may include a storage device for storing data in a semiconductor memory. When the memory system 1000 is used as the SSD, operational rates of the host coupled to the memory system 1000 may be innovatively improved.

In some embodiments, the memory system 1000 may be used as one of several elements in various electronic devices such as a computer, an ultra mobile PC UMPC, a workstation, a net-book, a personal digital assistants PDA, a portable computer, a web table, a wireless phone, a mobile phone, a smart phone, an e-book, a portable multimedia player PMP, a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environment, devices for home network, devices for computer network, devices for telematics network, an RFID device, and/or other devices for computing systems, etc.

In some embodiments, the semiconductor memory device 100 or the memory system 1000 may be packaged variously. In some examples, the semiconductor memory device 100 or the memory system 1000 may be packaged by various methods such as a package on package PoP, a ball grid arrays BGAs, a chip scale packages CSPs, a plastic leaded chip carrier PLCC, a plastic dual in line package PDIP, a die in waffle pack, a die in wafer form, a chip on board COB, a ceramic dual in line package CERDIP, a plastic metric quad flat pack MQFP, a thin quad flatpack TQFP, a small outline SOIC, a shrink small outline package SSOP, a thin small outline TSOP, a thin quad flatpack TQFP, a system in package SIP, a multi chip package MCP, a wafer-level fabricated package WFP, and/or a wafer-level processed stack package WSP, etc.

Figure 16:
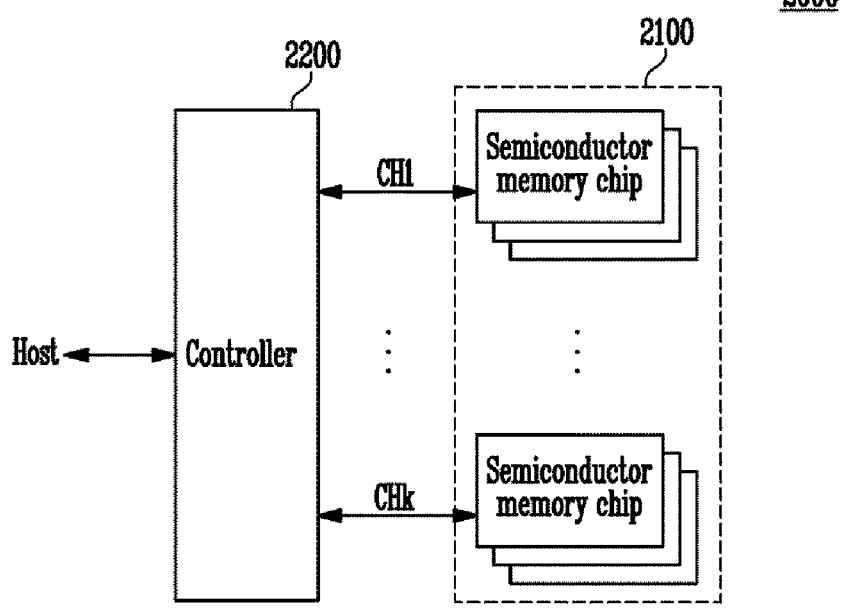
FIG. 16 is a block diagram illustrating a memory system according to some embodiments.

FIG. 16 is a block diagram illustrating a memory system according to some embodiments.

In FIG. 16, a memory system 2000 may include a semiconductor memory device 2100 and a controller 2200. The semiconductor memory device 2100 may include semiconductor memory chips. The semiconductor memory chips may be divided into groups. Each of the groups may communicate with the controller 2200 through one common channel. FIG. 16 shows the groups may communicate with the controller 2200 through a first to a kth channels CH1-CHk. Each of the semiconductor memory chips may perform the same operation as the semiconductor memory device 100 described with reference to FIG. 1.

In FIG. 16, many semiconductor memory chips may be coupled to one channel. In some embodiments, only one semiconductor memory chip may be coupled to one channel.

FIG. 17 is a block diagram illustrating a computing system 3000 including the memory system in FIG. 16 according to some embodiments. In FIG. 17, the computing system 3000 may include a central processing unit 3100, a random access memory RAM 3200, a user interface 3300, an electric source 3400, a system bus 3500, and a memory system 2000.

The memory system 2000 may be electrically connected to the central processing unit 3100, the RAM 3200, the user interface 3300 and the electric source 3400 through the system bus 3500. Data provided trough the user interface 3300 or processed by the central processing unit 3100 may be stored in the memory system 2000.

In FIG. 17, the semiconductor memory device 2100 may be coupled to the system bus 3500 through the controller 2200. In some embodiments, the semiconductor memory device 2100 may be directly coupled to the system bus 3500. In some embodiments, functions of the controller 2200 may be performed by the central processing unit 3100 and the RAM 3200.

In some embodiments, the memory system 2000 in FIG. 16 may be included in the memory system 3000. In some embodiments, the memory system 2000 may be replaced with the memory system 1000 as shown FIG. 15. In some embodiments, the computing system 3000 may include both the memory system 1000 and 2000.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor memory device comprising:
a memory cell array;
a page buffer coupled to the memory cell array through sensing nodes; and
a pass and fail check circuit, a first distance between the memory cell array and the pass and fail check circuit being higher than a second distance between the memory cell array and the page buffer;
wherein the page buffer is configured to control a voltage of a first line based on voltages of the sensing nodes;
wherein the pass and fail check circuit includes:
a current mirror section configured to mirror current of the first line to a second line;
transistors coupled in parallel between the current mirror section and a supply node; and
a comparator configured to compare the voltage of the first line with a voltage of the second line to generate a pass and fail check signal.

2. The semiconductor memory device of claim 1 wherein the current flowing through the first line is controlled by selectively turning on one or more of the transistors.

3. The semiconductor memory device of claim 1 wherein current flowing through the second line is controlled by selectively turning on one or more of the transistors.

4. The semiconductor memory device of claim 1 wherein:
the current mirror section includes at least one first transistor coupled to the first line and at least one second transistor coupled to the second line; and
the transistors coupled in parallel include third transistors coupled between the first transistor and the supply node and fourth transistors coupled between the second transistor and the supply node.

5. The semiconductor memory device of claim 4 wherein:
gates of the first transistors are coupled to the first line; and
the gates of the first transistors are coupled to gates of the second transistors.

6. The semiconductor memory device of claim 4, further comprising a control logic configured to provide:
detect current control signals to gates of the third transistors; and
mirroring current control signals to gates of the fourth transistors.

7. The semiconductor memory device of claim 1 wherein the pass and fail check circuit further includes reference transistors coupled in parallel between the second line and a reference node.

8. The semiconductor memory device of claim 7, further comprising a control logic configured to provide bit set signals to gates of the reference transistors.

9. The semiconductor memory device of claim 1 wherein:
the page buffer includes detect transistors coupled in parallel between the first line and a reference node; and
gates of the detect transistors are coupled to the sensing nodes.

* * * * *